United States Patent
Wu et al.

(10) Patent No.: US 8,757,985 B2
(45) Date of Patent: *Jun. 24, 2014

(54) FAN CONTROL CIRCUIT

(75) Inventors: Kang Wu, Shenzhen (CN); Guo-Yi Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 105 days.

This patent is subject to a terminal disclaimer.

(21) Appl. No.: 13/228,462

(22) Filed: Sep. 9, 2011

(65) Prior Publication Data

US 2012/0301321 A1    Nov. 29, 2012

(30) Foreign Application Priority Data

May 27, 2011 (CN) .......................... 2011 1 0139899

(51) Int. Cl.
*F04B 49/00* (2006.01)
*F04B 49/06* (2006.01)

(52) U.S. Cl.
USPC ............................................. 417/1; 417/44.1

(58) Field of Classification Search
USPC .................................................. 417/44.1, 1
See application file for complete search history.

(56) References Cited

U.S. PATENT DOCUMENTS

| | | | | |
|---|---|---|---|---|
| 7,132,809 B1* | 11/2006 | Chang | | 318/400.13 |
| 7,355,359 B2* | 4/2008 | Kuo | | 318/268 |
| 8,055,124 B2* | 11/2011 | Pan | | 388/811 |
| 8,248,016 B2* | 8/2012 | Huang | | 318/471 |
| 2010/0145548 A1* | 6/2010 | Ou et al. | | 700/300 |
| 2011/0084632 A1* | 4/2011 | Ou | | 318/268 |
| 2011/0169467 A1* | 7/2011 | Pan et al. | | 323/282 |
| 2012/0081056 A1* | 4/2012 | Tian et al. | | 318/472 |

* cited by examiner

*Primary Examiner* — Devon Kramer
*Assistant Examiner* — Lilya Pekarskaya
(74) *Attorney, Agent, or Firm* — Novak Druce Connolly Bove + Quigg LLP

(57) ABSTRACT

A fan control circuit of a computer includes a fan interface connected to a connector of a fan, a fan controller and an electronic switch chip. The fan controller outputs a pulse width modulation (PWM) signal to the fan interface to control the operation of the fan, and includes a general purpose input/output (GPIO) interface to output a voltage control signal to the electronic switch chip to switch the electronic switch chip on or off. The voltage control signal is at a low level at the start up moment of the computer, and thus does not turn on the fan via the electronic switch chip. After a preset delay period, the voltage control signal becomes a high-level signal under the control of the fan controller so that the fan interface receives the PWM signal.

1 Claim, 1 Drawing Sheet

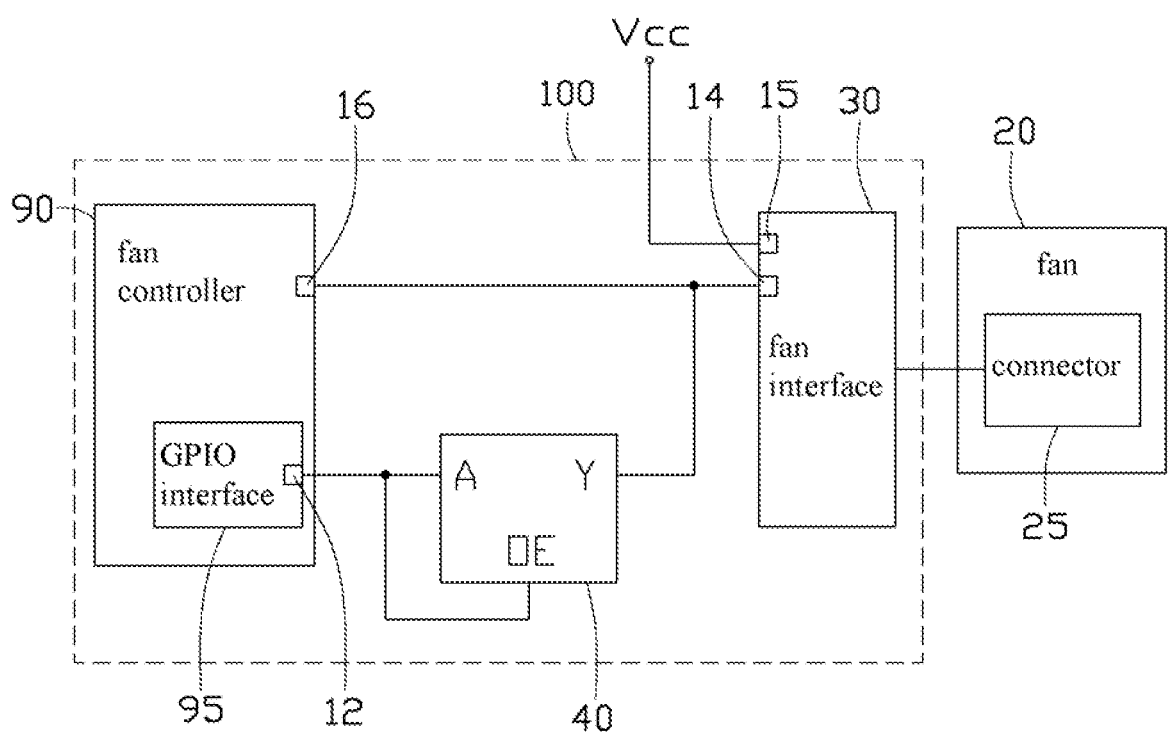

FAN CONTROL CIRCUIT

CROSS-REFERENCE TO RELATED APPLICATIONS

This application is related to a U.S. patent application entitled "FAN CONTROL CIRCUIT," with the same assignee as the instant application and with application Ser. No. 13/228,461. The disclosure of the above identified application is incorporated herein by reference.

BACKGROUND

1. Technical Field

The present disclosure relates to a fan control circuit.

2. Description of Related Art

Many servers include multiple fans, which begin to rotate at full speed at the moment of the server being started up. The power consumed by the interior components of the server, such as motherboards, hard disk drives and fans, can be up to a thousand kilowatts at the start up moment, which may cause instability in the power supply to the server, and high power consumption. Delay circuitry can be used to make the fans start operating after a preset delay period, however, many delay circuits include multiple extra components, which results in high cost.

BRIEF DESCRIPTION OF THE DRAWING

Many aspects of the embodiments can be better understood with reference to the drawing. The components in the drawing are not necessarily drawn to scale, the emphasis instead being placed upon clearly illustrating the principles of the present embodiments.

The drawing is a block diagram of an exemplary embodiment of a fan control circuit connected to a fan via a fan connector.

DETAILED DESCRIPTION

The disclosure, including the accompanying drawing, is illustrated by way of example and not by way of limitation. It should be noted that references to "an" or "one" embodiment in this disclosure are not necessarily to the same embodiment, and such references mean at least one.

Referring to the figure, an exemplary embodiment of a fan control circuit 100 of a computer includes a fan controller 90, an electronic switch chip 40 and a fan interface 30 for connecting with a connector 25 of a fan 20.

The terminals of the fan interface 30 include a power pin 15 and a control pin 14. A power supply VCC is connected to the power pin 15 of the fan interface 30 to provide voltage for the operation of the fan 20.

The fan controller 90 includes a rotational speed control pin 16 which outputs a pulse width modulation (PWM) voltage, and a general purpose input/output (GPIO) interface 95 with a control pin 12 for outputting a control signal. The rotational speed control pin 16 is connected to the control pin 14 of the fan interface 30 to transmit the PWM signal to the fan interface 30 to control the operation of the fan 20. The voltage control signal at the control pin 12 of the electronic switch chip 40 is at a low level at the moment of the computer being started up, and after a preset delay period, becomes a high level signal under the control of the fan controller 90.

The electronic switch chip 40 (e.g. an NC7SV125P5X_DS chip) includes an enable terminal OE, a signal input terminal A, and a signal output terminal Y. The enable terminal OE and the signal input terminal A of the electronic switch chip 40 are connected to the control pin 12 of the GPIO interface 95, and the signal output terminal Y is coupled to the rotational speed control pin 16 of the fan controller 90. The electronic switch chip 40 is turned on only when the enable terminal OE of the electronic switch chip 40 receives a low-level signal.

As the computer starts up, the power supply VCC provides a constant voltage to the power pin 15 of the fan interface 30, and the rotational speed control pin 16 of the fan controller outputs a constant PWM signal to the control pin 14 of the fan interface 30. At the same time, the control pin 12 of the GPIO interface 95 outputs a low-level signal to the input terminal A and to the enable terminal OE of the electronic switch chip 40. The electronic switch chip 40 is turned on, and the low-level signal from the signal input terminal A of the electronic switch chip 40 is transmitted to the rotational speed control pin 16 of the fan controller 90 via the signal output terminal Y of the electronic switch chip 40. The PWM signal being received at the control pin 14 of the fan interface 30 simultaneously with the low-level signal from the output terminal Y of the electronic switch chip 40 sinks the voltage at the control pin 14 of the fan interface 30 to approximately zero, which leaves the fan 20 turned off.

After a preset delay period, the voltage control signal at the control pin 12 of the GPIO interface 95 becomes a high-level signal under the control of the fan controller 90. The resulting high-level signal is then sent to the enable terminal OE to turn off the electronic switch chip 40. The control pin 14 of the fan interface 30 receives a PWM signal from the rotational speed control pin 16 of the fan controller 90 to start and control the speed of operation of the fan 40.

The foregoing description of the exemplary embodiments of the disclosure has been presented only for the purposes of illustration and description and is not intended to be exhaustive or to limit the disclosure to the precise forms disclosed. Many modifications and variations are possible. The embodiments are described in order to explain the principles of the disclosure and their practical application so as to enable others of ordinary skill in the art to utilize the disclosure, with such various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than by the foregoing description and the exemplary embodiments described therein.

What is claimed is:

1. A fan control circuit of a computer, the fan control circuit comprising:

a fan interface connected to a connector of a fan of the computer, and comprising a first control pin;

an electronic switch chip comprising an enable terminal, a signal input terminal and a signal output terminal, wherein the electronic switch chip is turned on when the enable terminal receives a low-level signal; and a fan controller comprising a general purpose input/output (GPIO) interface and a rotational speed control pin, the rotational speed control pin connected to the first control pin of the fan interface and the signal output terminal of the electronic switch chip, the GPIO interface comprising a second control pin connected to the signal input terminal and the enable terminal of the electronic switch chip for outputting a control signal, wherein the control signal is at a low level at the moment of the computer being started up, the electronic switch chip is turned on and transmits a low-level signal to the first control pin of the fan interface, thereby the fan is not turned on; after a preset delay period of time after the computer is started up, the control signal at the second control pin of the GPIO interface becomes a high-level signal under the control of the fan controller, the electronic switch chip is turned off, and the rotational speed control pin of the fan controller outputs a pulse width modulation (PWM) signal to the first control pin of the fan interface to control the operation of the fan.

* * * * *